United States Patent
Yamamoto et al.

(10) Patent No.: US 8,796,780 B2
(45) Date of Patent: Aug. 5, 2014

(54) SEMICONDUCTOR DEVICE AND MANUFACTURING METHOD THEREOF

(75) Inventors: Yoshiki Yamamoto, Tokyo (JP); Yukio Nishida, Tokyo (JP); Jiro Yugami, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 610 days.

(21) Appl. No.: 12/572,646

(22) Filed: Oct. 2, 2009

(65) Prior Publication Data

US 2010/0102395 A1     Apr. 29, 2010

(30) Foreign Application Priority Data

Oct. 27, 2008 (JP) .................................. 2008-275097

(51) Int. Cl.
    *H01L 29/72*     (2006.01)
(52) U.S. Cl.
    USPC ............ 257/369; 257/E27.062; 257/E21.158; 257/E21.832
(58) Field of Classification Search
    USPC ............ 257/369, E27.062, E21.158, E21.832
    See application file for complete search history.

(56) References Cited

U.S. PATENT DOCUMENTS

| | | | |
|---|---|---|---|
| 6,545,324 B2 | 4/2003 | Madhukar et al. | |
| 8,034,678 B2 | 10/2011 | Kobayashi | |
| 2007/0096226 A1* | 5/2007 | Liu et al. | 257/411 |
| 2010/0052066 A1* | 3/2010 | Yu et al. | 257/369 |

FOREIGN PATENT DOCUMENTS

| | | |
|---|---|---|
| JP | 2007-200946 | 8/2007 |
| JP | 2009-194352 A | 8/2009 |

OTHER PUBLICATIONS

Mise, N., et al., "Single Metal/Dual High-k Gate Stack with Low $V_{th}$ and Precise Gate Profile Control for Highly Manufacturable Aggressively Scaled CMISFETs", 2007, pp. 527-530, IEEE.
Japanese Office Action issued in Application No. 2008-275097 dated Apr. 23, 2013.

* cited by examiner

*Primary Examiner* — Edward Wojciechowicz
(74) *Attorney, Agent, or Firm* — McDermott Will & Emery LLP

(57) ABSTRACT

Provided is a semiconductor device capable of having a single metal/dual high-k structure with a good shape and having flat band voltages suited for nMOS and pMOS, respectively. The semiconductor device according to the one embodiment of the present invention has a first conductivity type MOSFET and a second conductivity type MOSFET. The first and second conductivity type MOSFETs are each equipped with a first insulating film formed over a semiconductor substrate, a second insulating film formed over the first insulating film and made of an insulating material having a higher dielectric constant than the first insulating film, and a gate electrode formed over the second insulating film and having, as a lower layer of the gate electrode, a metal layer containing a material which diffuses into the second insulating film to control a work function thereof. The second conductivity type MOSFET is equipped further with a diffusion barrier film formed between the first insulating film and the second insulating film to prevent diffusion of a work-function controlling material into the interface of the first insulating film.

2 Claims, 8 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2008-275097 filed on Oct. 27, 2008 including the specification, drawings and abstract is incorporated herein by reference in its entirety.

BACKGROUND OF THE INVENTION

The present invention relates to a semiconductor device and a manufacturing method thereof, in particular, to a semiconductor device equipped with CMOSFET having a high-k/metal gate structure and a manufacturing method of the device.

In order to improve an integration density and performance of semiconductor devices, miniaturization of MOSFET (Metal-Oxide-Semiconductor Field-Effect Transistor), which is a constituent component of the semiconductor devices, has been continuously progressing. With realization of miniaturization, however, an influence of a short-channel effect is increasing. Control of this influence is therefore considered to be important. As a measure against this problem, high-k (high dielectric constant) gate insulating film/metal gate structures are known. In these structures, sufficient thickness of the insulating film enables to decrease a leakage current caused by a quantum tunneling effect and at the same time, use of the high-dielectric-constant insulating film enables to raise the amount of current. In addition, use of a metal gate in combination is effective for suppressing phonon oscillation.

In the typical gate first process, gates of CMOSFET having high-k/metal gate structures are formed by the following manufacturing process. First, after deposition of either an n type or a p type gate metal, the gate metal is removed by etching from a region having a polarity opposite thereto. Then, a metal having a polarity opposite to that of the metal deposited first is deposited over the metal removed region. A substance (typically, poly-Si or W) for making gates of equal height or equal resistance is deposited, followed by gate etching to form the gates.

When the typical gate first process as described above is employed, however, a dual metal gate is formed using metals having different work functions for the n type and p type, respectively. This means that materials different in physical and chemical properties should be etched simultaneously, leading to a problem, that is, difficulty in processing.

As a resolution of this problem, there is known a method of forming a capping layer on the high-k film and controlling the work function by using one gate metal. In this CMOSFET using the capping layer, a gate is obtained by forming a high-k gate insulating film, depositing a capping layer, removing the capping layer from a region of a polarity which does not need the capping layer, depositing a gate metal, depositing poly-Si or W, and then etching.

The technologies related to the above description are disclosed in the following Patent Documents 1 and 2, and Non-patent Document 1.
[Patent Document] U.S. Pat. No. 6,545,324
[Patent Document 2] Japanese Unexamined Patent Publication No. 2007-200946
[Non-patent Document 1] IEDM2007, "Single Metal/Dual High-k Gate Stack with Low Vth and Precise Gate Profile Control for Highly Manufacturable Aggressively Scaled CMISFETs", Mise, N et. al, pp 527-530

SUMMARY OF THE INVENTION

The semiconductor device using a capping layer does not pose the problem of processability in gate etching, because it uses one kind of a metal and one kind of a high-k insulating film. In a step of removing the capping layer from either an n type region or a p type region, La compounds used ordinarily for the capping layer are so strongly hygroscopic that they cannot be removed easily through a mask. It is therefore difficult to form a capping layer with a good shape and thereby control the work function.

The invention has been made with a view to overcoming such problems. An object of the invention is to provide a semiconductor device capable of having a single metal/dual high-k structure with a good shape and having flat band voltages suited for nMOS and pMOS, respectively; and a manufacturing method of the device.

A semiconductor device according to one embodiment of the invention has a first conductivity type MOSFET and a second conductivity type MOSFET. The first conductivity type MOSFET and the second conductivity type MOSFET are each equipped with a first insulating film formed over a semiconductor substrate, a second insulating film formed over the first insulating film and made of an insulating material having a higher dielectric constant than the first insulating film, and a gate electrode formed over the second insulating film and having, as a lower layer of the gate electrode, a metal layer containing a material which diffuses into the second insulating film to control the work function thereof. The second conductivity type MOSFET is equipped further with a diffusion barrier film formed between the first insulating film and the second insulating film to prevent diffusion of the work-function controlling material into the interface of the first insulating film.

A semiconductor device according to another embodiment of the invention has a first conductivity type MOSFET and a second conductivity type MOSFET. The first conductivity type MOSFET and the second conductivity type MOSFET are each equipped with a first insulating film formed over a semiconductor substrate, a second insulating film formed over the first insulating film and made of an insulating material having a higher dielectric constant than the first insulating film, a cap layer formed over the second insulating film and containing a material which diffuses into the second insulating film to control the work function thereof, and a gate electrode formed over the cap layer and having a metal layer as a lower layer of the gate electrode. The second conductivity type MOSFET is equipped further with a diffusion barrier film formed between the first insulating film and the second insulating film to prevent diffusion of the work-function controlling material into the interface of the first insulating film.

A semiconductor device according to a further embodiment of the invention has a first conductivity type MOSFET and a second conductivity type MOSFET. The first conductivity type MOSFET and the second conductivity type MOSFET are each equipped with a first insulating film formed over a semiconductor substrate, a second insulating film formed over the first insulating film and made of an insulating material having a higher dielectric constant than the first insulating film, and a gate electrode formed over the second insulating film and having, as a lower layer of the gate electrode, a metal layer containing a material which diffuses into the second insulating film to control the work function thereof. The second conductivity type MOSFET is equipped further with a diffusion barrier film formed between the second insulating film and the metal layer to prevent diffusion of the work-function controlling material into the second insulating film.

A semiconductor device according to a still further embodiment of the invention has a first conductivity type MOSFET and a second conductivity type MOSFET. The first conductivity type MOSFET and the second conductivity type MOSFET are each equipped with a first insulating film formed over a semiconductor substrate, a second insulating film formed over the first insulating film and made of an insulating material having a higher dielectric constant than the first insulating film, a cap layer formed over the second insulating film and containing a material which diffuses into the second insulating film to control the work function thereof, and a gate electrode formed over the cap layer and having, as a lower layer of the gate electrode, a metal layer. The second conductivity type MOSFET is equipped further with a diffusion barrier film formed between the second insulating film and the cap layer to prevent diffusion of the work-function controlling material into the second insulating film.

A manufacturing method of a semiconductor device according to one embodiment of the invention is that of a semiconductor device having a first conductivity type MOSFET and a second conductivity type MOSFET. First, a semiconductor substrate having, over the upper surface thereof, a first insulating film is prepared. Then, over the first insulating film, a diffusion barrier film for preventing diffusion of a work-function controlling material into the interface of the first insulating film is formed. The diffusion barrier film is then removed to expose the surface of the first insulating film in a first conductivity type MOSFET formation region. Then, over the first insulating film and the diffusion barrier film, a second insulating film made of an insulating material having a higher dielectric constant than the first insulating film is formed. Over the second insulating film, a gate electrode having, as a lower layer thereof, a metal layer containing a material which diffuses into the second insulating film to control the work function thereof is formed.

A manufacturing method of a semiconductor device according to another embodiment of the invention is that of a semiconductor device having a first conductivity type MOSFET and a second conductivity type MOSFET. First, a semiconductor substrate having, over the upper surface thereof, a first insulating film is prepared. Then, over the first insulating film, a diffusion barrier film for preventing diffusion of a work-function controlling material into the interface of the first insulating film is formed. The diffusion barrier film is then removed to expose the surface of the first insulating film in a first conductivity type MOSFET formation region. Then, over the first insulating film and the diffusion barrier film, a second insulating film made of an insulating material having a higher dielectric constant than the first insulating film is formed. Over the second insulating film, a cap layer containing a material which diffuses into the second insulating film to control the work function thereof is formed. A gate electrode having, as a lower layer thereof, a metal layer is formed over the cap layer.

A manufacturing method of a semiconductor device according to a further embodiment of the invention is that of a semiconductor device having a first conductivity type MOSFET and a second conductivity type MOSFET. First, a semiconductor substrate having, over the upper surface thereof, a first insulating film is prepared. Then, over the first insulating film, a second insulating film made of an insulating material having a higher dielectric constant than the first insulating film is formed. Over the second insulating film, a diffusion barrier film for preventing diffusion of a work-function controlling material into the second insulating film is formed. The diffusion barrier film is then removed to expose the surface of the second insulating film in the first conductivity type MOSFET formation region. Then, over the second insulating film and the diffusion barrier film, a gate electrode having, as a lower layer thereof, a metal layer which diffuses into the second insulating film to control the work function thereof is formed.

A manufacturing method of a semiconductor device according to a still further embodiment of the invention is that of a semiconductor device having a first conductivity type MOSFET and a second conductivity type MOSFET. First, a semiconductor substrate having, over the upper surface thereof, a first insulating film is prepared. Then, over the first insulating film, a second insulating film made of an insulating material having a higher dielectric constant than the first insulating film is formed. Over the second insulating film, a diffusion barrier film for preventing diffusion of a work-function controlling material into the second insulating film is formed. The diffusion barrier film is then removed to expose the surface of the second insulating film in the first conductivity type MOSFET formation region. Then, over the second insulating film and the diffusion barrier film, a cap layer containing a material which diffuses into the second insulating film to control the work function thereof is formed. Over the cap layer, a gate electrode having, as a lower layer thereof, a metal layer is then formed.

According to the semiconductor device and the manufacturing method thereof in the one embodiment of the invention, the diffusion barrier film is formed between the first insulating film and the second insulating film in the second conductivity type region. Diffusion of the work-function controlling material of the metal layer into the first insulating film/second insulating film interface is thereby prevented in the second conductivity type region, while the work-function controlling material of the metal layer diffuses into the first insulating film/second insulating film interface in the first conductivity type region. As a result, a single metal/dual high-k structure with a good shape can be formed without processing a highly hygroscopic La compound and at the same time, flat band voltages suited for nMOS and pMOS, respectively, can be achieved.

According to the semiconductor device and the manufacturing method thereof in the another embodiment of the invention, the diffusion barrier film is formed between the first insulating film and the second insulating film in the second conductivity type region. Diffusion of the work-function controlling material of the cap layer into the first insulating film/second insulating film interface is thereby prevented in the second conductivity type region, while the work-function controlling material of the cap layer diffuses into the first insulating film/second insulating film interface in the first conductivity type region. As a result, a single metal/dual high-k structure with a good shape can be formed without processing a highly hygroscopic La compound and at the same time, flat band voltages suited for nMOS and pMOS, respectively, can be achieved.

According to the semiconductor device and the manufacturing method thereof in the further embodiment of the invention, the diffusion barrier film is formed between the second insulating film and the metal layer in the second conductivity type region. Diffusion of the work-function controlling material of the metal layer into the second insulating film is thereby prevented in the second conductivity type region, while the work-function controlling material of the metal layer diffuses into the first insulating film/second insulating film interface in the first conductivity type region. As a result, a single metal/dual high-k structure with a good shape can be formed without processing a highly hygroscopic La compound and at the same time, flat band voltages suited for nMOS and pMOS, respectively, can be achieved.

According to the semiconductor device and the manufacturing method thereof in the still further embodiment of the invention, the diffusion barrier film is formed between the second insulating film and the cap layer in the second conductivity type region. Diffusion of the work-function controlling material of the cap layer into the second insulating film is thereby prevented in the second conductivity type region, while the work-function controlling material of the cap layer diffuses into the first insulating film/second insulating film interface in the first conductivity type region. As a result, a single metal/dual high-k structure with a good shape can be formed without processing a highly hygroscopic La compound and at the same time, flat band voltages suited for nMOS and pMOS, respectively, can be achieved.

DETAILED DESCRIPTION OF THE INVENTION

Embodiment 1

Figure 1:
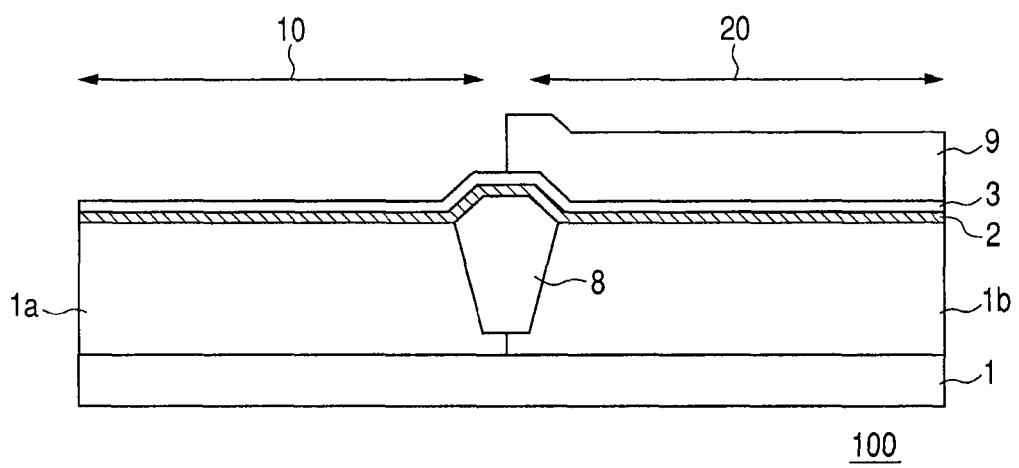
FIG. 1 is a cross-sectional view illustrating a manufacturing step of a semiconductor device according to Embodiment 1.

FIGS. 1 to 5 are cross-sectional views illustrating the manufacturing steps of a semiconductor device 100 according to Embodiment 1 of the invention. First, the gate configuration of the semiconductor device 100 of this embodiment will be described referring to FIG. 5.

The semiconductor device 100 of this embodiment has a CMOSFET structure composed of an n-MOSFET region 10 and a p-MOSFET region 20. The n-MOSFET region 10 and the p-MOSFET region 20 are each equipped with a semiconductor substrate 1 (the n-MOSFET region 10 has a p well 1a on the surface layer, while the p-MOSFET region 20 has an n-well 1b on the surface layer), a silicon oxide film interfacial layer 2 (first insulating film) formed over the semiconductor substrate 1, a high-k insulating film 4 (second insulating film) formed over the silicon oxide film interfacial layer 2, and a gate electrode 7 having a metal layer 5 and a poly-Si layer 6 (or W) formed over the high-k insulating film 4. The p-MOSFET region 20 is equipped further with a diffusion barrier film 3 between the silicon oxide film interfacial layer 2 and the high-k insulating film 4. The first insulating film may be alternatively a silicon nitride film interfacial layer.

A manufacturing method of the semiconductor device 100 will next be described referring to FIGS. 1 to 5. First, an element isolation region 8 is formed in a semiconductor substrate 1 to partition it into an n-MOSFET region 10 and a p-MOSFET region 20. Well implantation is then carried out to form a p-well 1a in the n-MOSFET region 10 and an n-well 1b in the p-MOSFET region 20. Next, a silicon oxide film interfacial layer 2 for forming a high-k insulating film is then formed over the upper surface of the semiconductor substrate 1.

Figure 2:
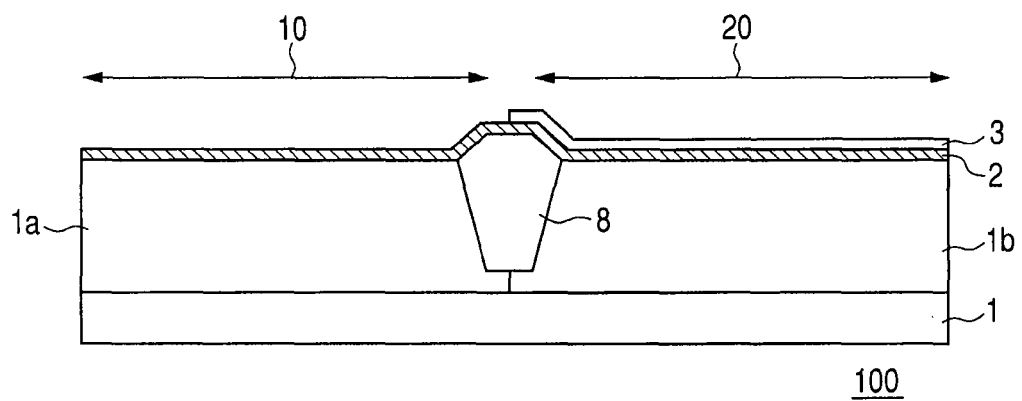
FIG. 2 is a cross-sectional view illustrating a manufacturing step of the semiconductor device according to Embodiment 1.

A diffusion barrier film 3 ($Al_2O_3$, Al, SiN or the like) of from about 0.3 nm to 2.0 nm thick is then formed over the silicon oxide film interfacial layer 2 by ALD (Atomic Layer Deposition) or the like. After formation of a resist pattern 9 for covering the p-MOSFET region 20 therewith (FIG. 1), the diffusion barrier film 3 is removed from the n-MOSFET region 10 by patterning with an HF solution or the like (FIG. 2). At this stage, the diffusion barrier film 3 may be densified by applying a heat treatment thereto.

Figure 3:
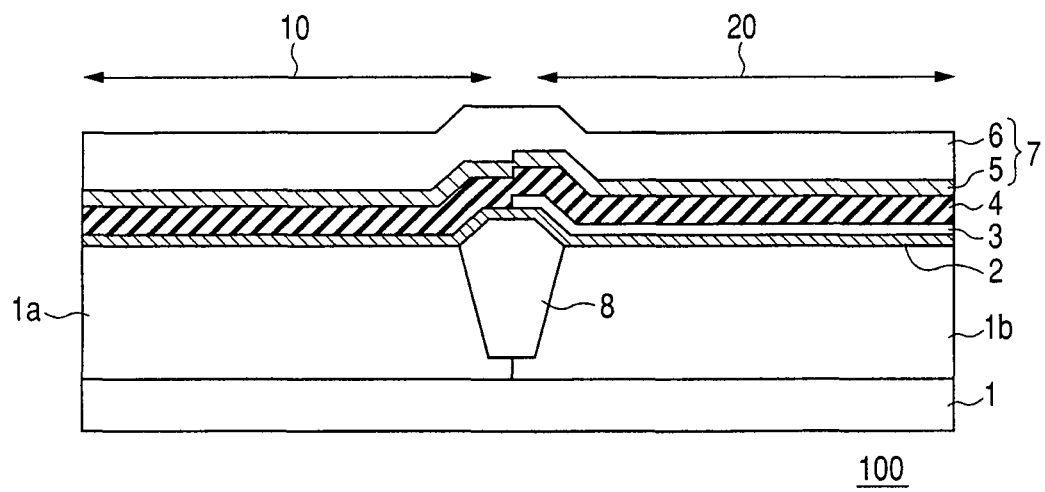
FIG. 3 is a cross-sectional view illustrating a manufacturing step of the semiconductor device according to Embodiment 1.

Next, an interfacial layer is formed again in the n-MOSFET region 10 if necessary and a high-k insulating film 4 (from about 1 to 4 nm thick), which is an insulating material having a higher dielectric constant than that of the silicon oxide film interfacial layer 2, is formed over the silicon oxide film interfacial layer 2 and the diffusion barrier film 3. A gate electrode 7 is the formed by successively stacking a metal layer 5 (from about 5 to 20 nm thick) and a poly-Si layer 6 or W (from about 80 to 120 nm thick) over the high-k insulating film 4 (FIG. 3).

The metal layer 5 used in this embodiment is comprised of a metal having a work function suited for the formation of the p-MOSFET 20 and at the same time, contains a rare earth element or Mg. For example, the metal layer 5 is comprised of TiYbN, while the high-k insulating film 4 is comprised of HfSiON or the like.

Figure 4:
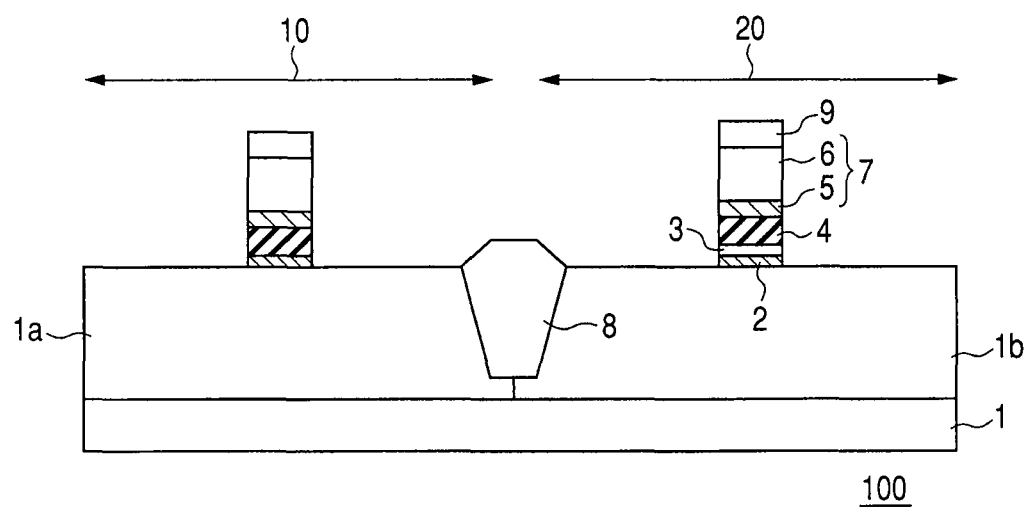
FIG. 4 is a cross-sectional view illustrating a manufacturing step of the semiconductor device according to Embodiment 1.

Then, a mask is formed and with this mask, the silicon oxide film interfacial layer 2, the diffusion barrier film 3, the high-k insulating film 4, and the gate electrode 7 are etched to form a gate pattern (FIG. 4). At this stage, since the same metal is used in both the n-MOSFET region 10 and the p-MOSFET region 20, the difficulty encountered in conventional dual metal formation does not occur during etching.

The gate at this stage has a poly-Si (or W)/metal/high-k/SiO/Si structure in the n-MOSFET region 10, while it has a poly-Si (or W)/metal/high-k/diffusion barrier film/SiO/Si structure in the p-MOSFET region 20.

Figure 5:
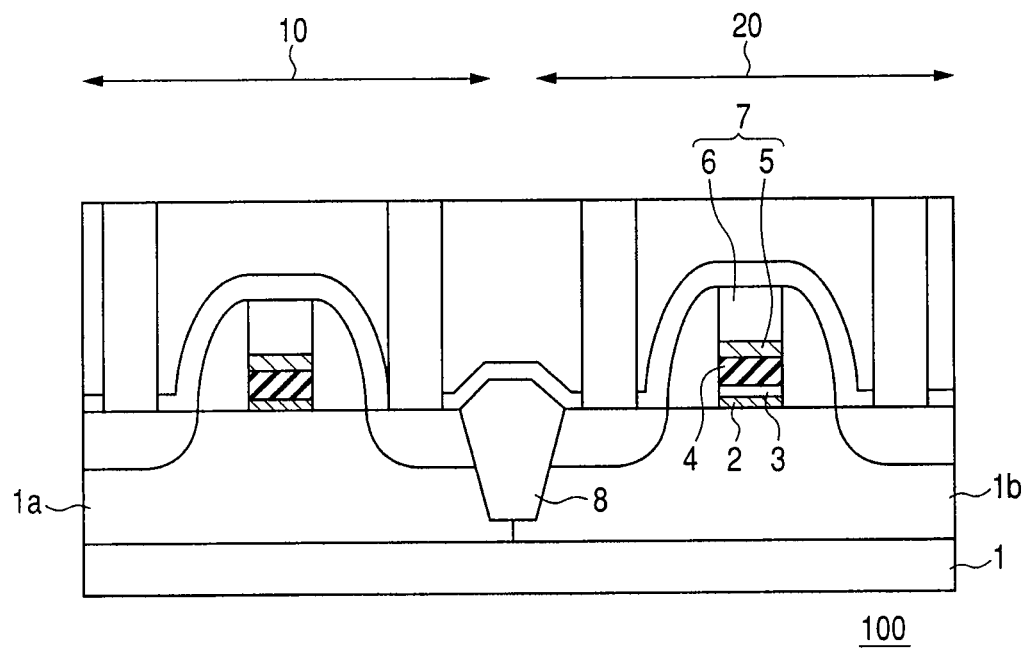
FIG. 5 is a cross-sectional view illustrating a manufacturing step of the semiconductor device according to Embodiment 1.

After gate etching, offset formation, extension implantation, SW formation, deep S/D implantation, silicide formation, and contact formation are performed as in the fabrication of a conventional transistor (FIG. 5). Due to high-temperature heat treatment such as S/D activation annealing, the rare earth element or Mg contained in the metal layer 5 diffuses into the high-k insulating film 4 and it reaches even a high-k/SiO interface in the n-MOSFET region 10. In the p-MOSFET region 20, on the other hand, the diffusion barrier film 3 prevents diffusion of the rare earth element or Mg contained in the metal layer 5 into a high-k/SiO (N) interface which will otherwise occur due to heat treatment.

In order to control a flat-band voltage (VFB) in a dual high-k structure, the composition of the high-k insulating film 4 at the high-k/SiO (N) interface is important. It is known that Mg or rare earth elements shift the VFB to a negative direction, while Al shifts the VFB to a positive direction. When a work-function controlling material is mixed in the high-k insulating film 4, it is known, as a method therefor, to form, a layer containing the work-function controlling material over the high-k insulating film 4 and then diffusing the material by a heat treatment performed later.

According to the semiconductor device 100 of the present embodiment, the work function therefore decreases to a value suited for the n-MOSFET by the diffusion of the rare earth element or Mg into the high-k/SiO(N) interface in the n-MOSFET region 10. In the p-MOSFET region 20, on the other hand, this diffusion is suppressed and the work function remains suited for the p-MOSFET. In addition, due to $Al_2O_3$, Al, SiN, or the like used for the diffusion barrier film 3, Al or the like is present in the high-k/SiO(N) interface so that it shifts the VFB of the p-MOSFET region to a positive direction, making it possible to achieve a higher work function.

Accordingly, it is possible to form a single metal/dual high-k structure with a good shape without processing a highly hygroscopic La compound and therefore achieve flat band voltages suited for the n-MOSFET region 10 and the p-MOSFET region 20, respectively.

Embodiment 2

Figure 6:
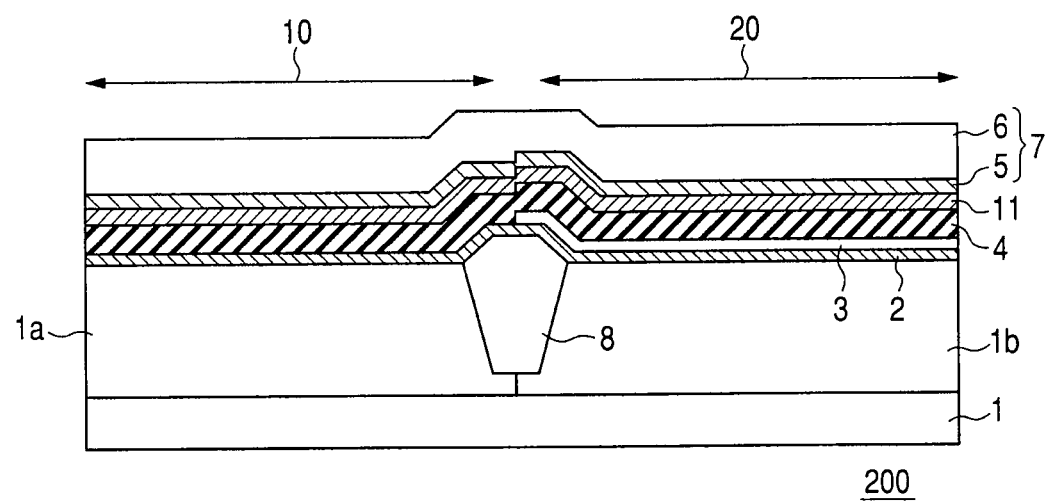
FIG. 6 is a cross-sectional view illustrating a manufacturing step of a semiconductor device according to Embodiment 2.
Figure 7:
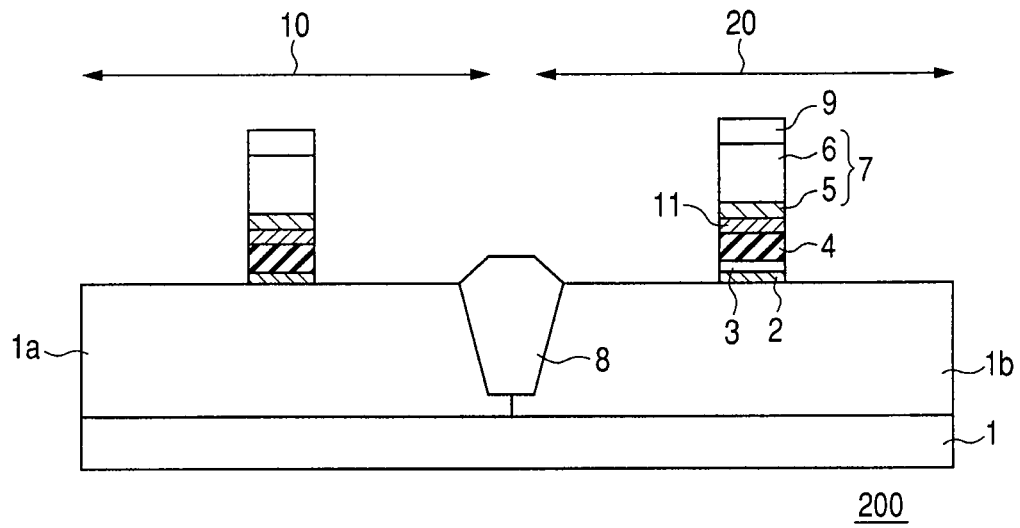
FIG. 7 is a cross-sectional view illustrating a manufacturing step of the semiconductor device according to Embodiment 2.
Figure 8:
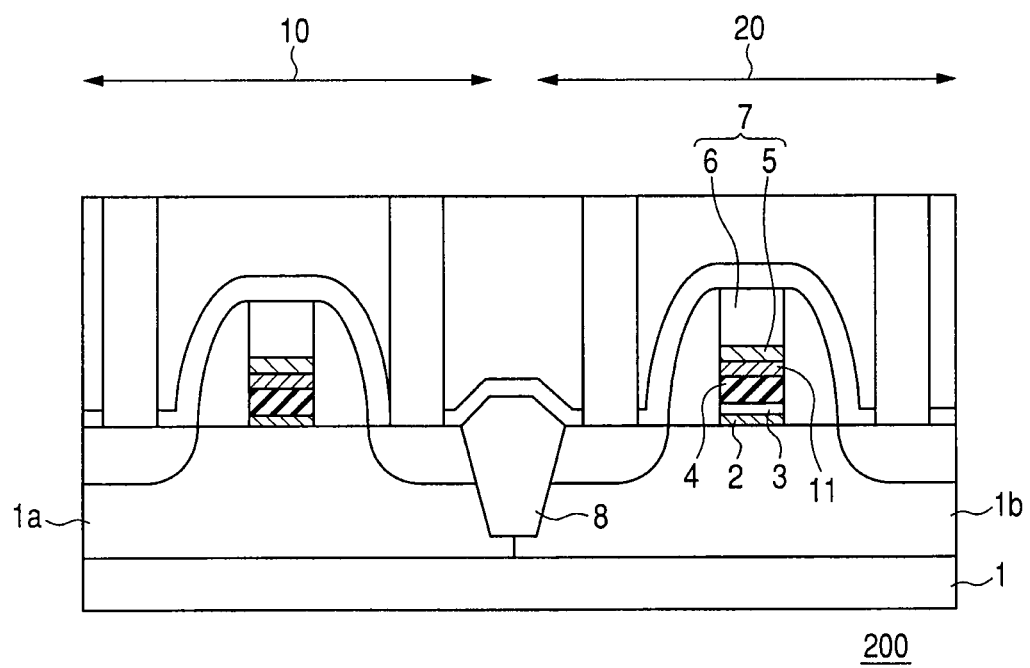
FIG. 8 is a cross-sectional view illustrating a manufacturing step of the semiconductor device according to Embodiment 2.

FIGS. 6 to 8 are cross-sectional views illustrating the manufacturing steps of a semiconductor device 200 in Embodiment 2 of the invention. They correspond to FIGS. 3 to 5 in Embodiment 1. Drawings showing the other manufacturing steps are omitted because they are similar to those of Embodiment 1. The semiconductor device 200 of this embodiment has, in addition to the configuration of the semiconductor device 100, a capping layer 11 (cap layer) between the high-k insulating film 4 and the metal layer 5.

A manufacturing method of the semiconductor device 200 will next be described referring to FIGS. 6 to 8. Description on the steps illustrated in FIGS. 1 and 2 is omitted because they are similar to those in Embodiment 1. After patterning the diffusion barrier film 3, an interfacial layer is formed again in the n-MOSFET region 10 if necessary and a high-k insulating film 4 (from about 1 to 4 nm thick), which is an insulating material having a higher dielectric constant than that of the silicon oxide film interfacial layer 2, over the silicon oxide film interfacial layer 2 and the diffusion barrier film 3. Then, a capping layer 11 containing a rare earth element or Mg is formed over the high-k insulating film 4. A gate electrode 7 is then formed by successively stacking a metal layer 5 (from about 5 to 20 nm thick) and a poly-Si layer 6 or W (from about 80 to 120 nm thick) (FIG. 6).

The metal layer 5 to be used in this embodiment is comprised of a metal having a work function suited for the formation of the p-MOSFET 20. For example, the metal layer 5 is comprised of TiN, the high-k insulating film 4 is comprised of HfSiON, and the capping layer 11 is comprised of $La_2O_3$.

Then, a mask is formed and with this mask, a gate pattern is formed by etching the silicon oxide film interfacial layer 2, the diffusion barrier film 3, the high-k insulating film 4, the capping layer 11, and the gate electrode 7 (FIG. 7). Since the same metal is used in both the n-MOSFET region 10 and the p-MOSFET region 20, the difficulty encountered in conventional dual metal formation does not occur during etching.

The gate thus obtained has a poly-Si (or W)/metal/capping layer/high-k/SiO/Si structure in the n-MOSFET region 10 and has a poly-Si (or W)/metal/capping layer/high-k/diffusion barrier film/SiO/Si structure in the p-MOSFET region 20.

After gate etching, offset formation, extension implantation, SW formation, deep S/D implantation, silicide formation, and contact formation are carried out as in the formation of a conventional transistor (FIG. 8). Due to high-temperature heat treatment such as S/D activation annealing, the rare earth element or Mg contained in the capping layer 11 diffuses into the high-k insulating film 4 and reaches even a high-k/SiO interface in the n-MOSFET region 10. In the p-MOSFET region 20, on the other hand, the diffusion barrier film 3 prevents diffusion of the rare earth element or Mg contained in the capping layer 11 into a high-k/SiO(N) interface.

According to the semiconductor device 200 of the present embodiment, the work function decreases to a value suited for the n-MOSFET by the diffusion of the rare earth element or Mg into the high-k/SiO(N) interface in the n-MOSFET region 10. In the p-MOSFET region 20, on the other hand, this diffusion is suppressed and the work function remains suited for the p-MOSFET. In addition, due to $Al_2O_3$, Al, SiN, or the like used for the diffusion barrier film 3, Al or the like is present in the high-k/SiO(N) interface so that it shifts the VFB of the p-MOSFET region to a positive direction, making it possible to achieve a higher work function.

Accordingly, it is possible to form a single metal/dual high-k structure with a good shape without processing a highly hygroscopic La compound and therefore achieve flat band voltages suited for the n-MOSFET region 10 and the p-MOSFET region 20, respectively.

Embodiment 3

FIGS. 9 to 13 are cross-sectional views illustrating the manufacturing steps of a semiconductor device 300 according to Embodiment 3 of the invention. First, the gate configuration of the semiconductor device 300 of this embodiment will be described referring to FIG. 13.

The semiconductor device 300 of this embodiment has a CMOSFET structure comprised of an n-MOSFET region 10 and a p-MOSFET region 20. The n-MOSFET region 10 and the p-MOSFET region 20 are each equipped with a semiconductor substrate 1 (having a p-well 1a in the surface layer of the n-MOSFET region 10 and an n-well 1b in the surface layer of the p-MOSFET region 20), a silicon oxide film interfacial layer 2 (first insulating film) formed over the semiconductor substrate 1, a high-k insulating film 4 (second insulating film) formed over the silicon oxide film interfacial layer 2, and a gate electrode 7 having a metal layer 5 and a poly-Si layer 6 (or W) over the high-k insulating film 4. The p-MOSFET region 20 is equipped further with a diffusion barrier film 3 between the high-k insulating film 4 and the metal layer 5. The first insulating film may be alternatively a silicon nitride film interfacial layer.

A manufacturing method of the semiconductor device 300 will next be described referring to FIGS. 9 to 13. First, an element isolation region 8 is formed in the semiconductor substrate 1 to partition it into an n-MOSFET region 10 and a p-MOSFET region 20. Well implantation is then carried out to form a p-well 1a in the n-MOSFET region 10 and an n-well 1b in the p-MOSFET region 20. Next, a silicon oxide film interfacial layer 2 for forming a high-k insulating film is then formed over the upper surface of the semiconductor substrate 1. A high-k insulating film 4 (from about 1 to 4 nm thick) which is an insulating material having a higher dielectric constant than that of the silicon oxide film interfacial layer 2 is then formed over the silicon oxide film interfacial layer 2.

Figure 9:
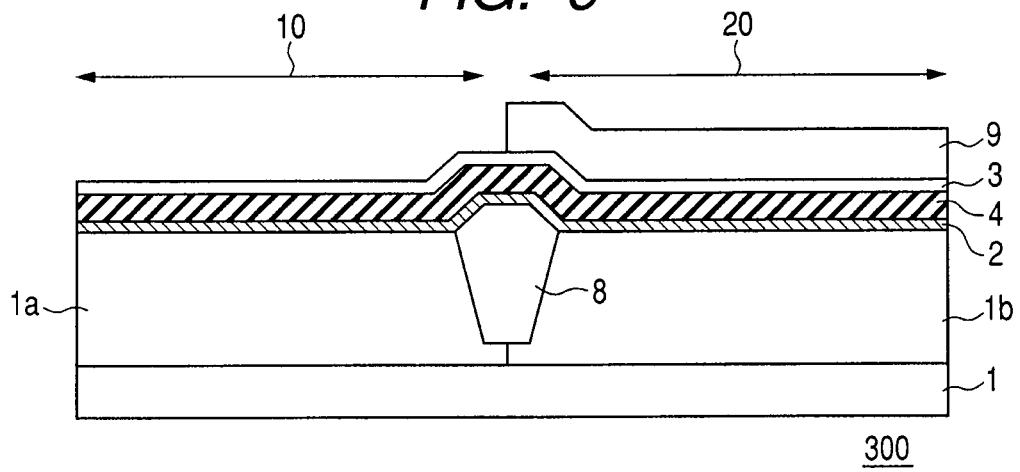
FIG. 9 is a cross-sectional view illustrating a manufacturing step of a semiconductor device according to Embodiment 3.
Figure 10:
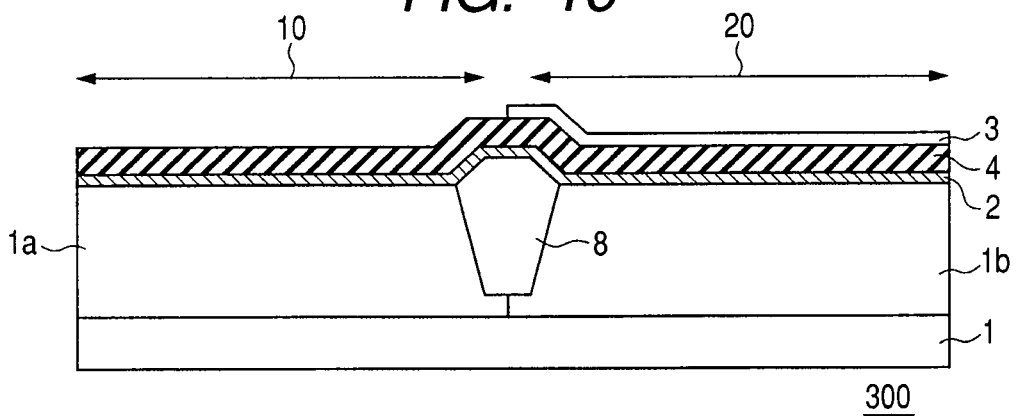
FIG. 10 is a cross-sectional view illustrating a manufacturing step of the semiconductor device according to Embodiment 3.

A diffusion barrier film 3 ($Al_2O_3$, Al, SiN or the like) of from about 0.3 nm to 2.0 nm thick is then formed over the high-k insulating film 4 by ALD or the like. After formation of a resist pattern 9 to cover the p-MOSFET region 20 therewith (FIG. 9), the diffusion barrier film 3 is removed from the n-MOSFET region 10 by patterning with an HF solution or the like (FIG. 10). At this stage, the diffusion barrier film 3 may be densified by applying a heat treatment thereto.

Figure 11:
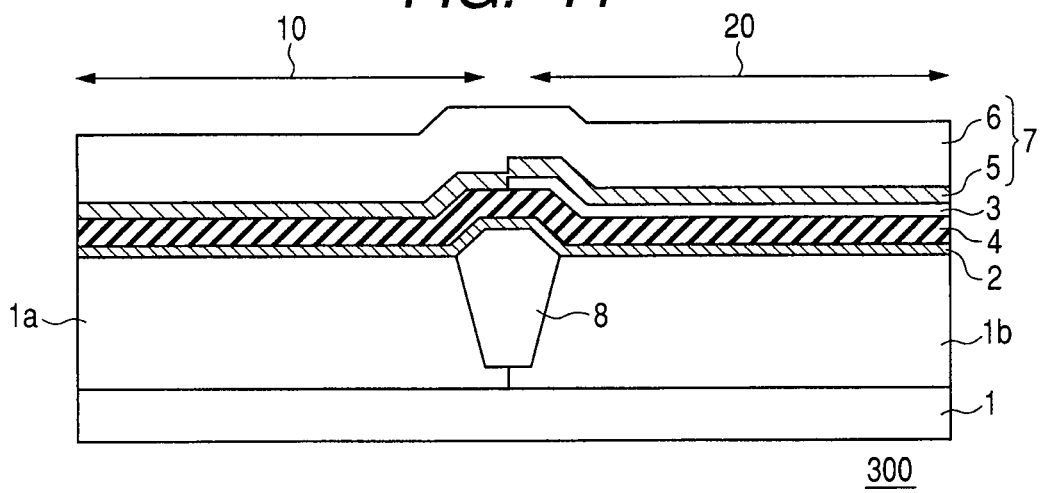
FIG. 11 is a cross-sectional view illustrating a manufacturing step of the semiconductor device according to Embodiment 3.

A gate electrode 7 is the formed by successively stacking a metal layer 5 (from about 5 to 20 nm thick) and a poly-Si layer 6 or W (from about 80 to 120 nm thick) over the high-k insulating film 4 and the diffusion barrier film 3 (FIG. 11).

The metal layer 5 used in this embodiment is comprised of a metal having a work function suited for the formation of the p-MOSFET 20 and at the same time, contains a rare earth element or Mg. For example, the metal layer 5 is comprised of TiYbN, TiGdN, or TaGdN, while the high-k insulating film 4 is comprised of HfSiON or the like.

Figure 12:
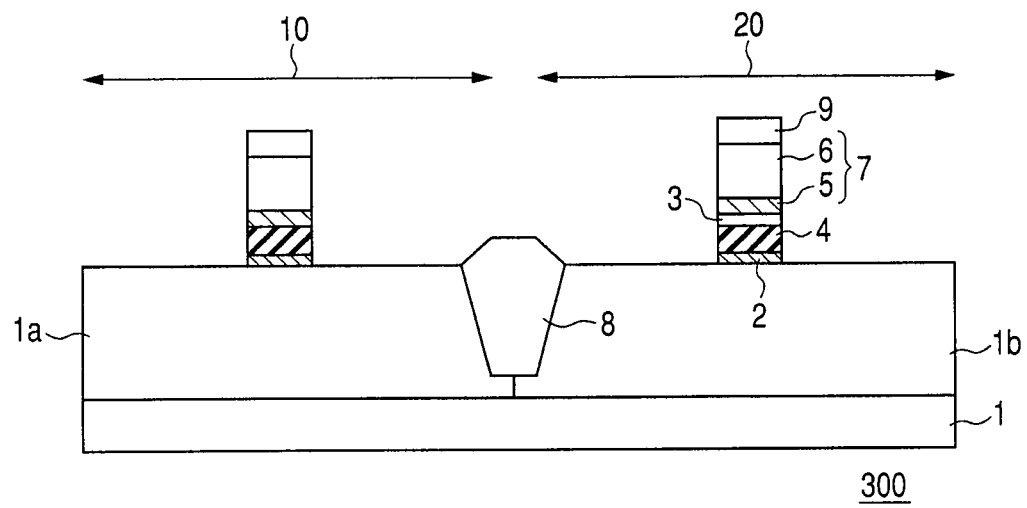
FIG. 12 is a cross-sectional view illustrating a manufacturing step of the semiconductor device according to Embodiment 3.

Then, a mask is formed and with this mask, the silicon oxide film interfacial layer 2, the diffusion barrier film 3, the high-k insulating film 4, and the gate electrode 7 are etched to form a gate pattern (FIG. 12). At this stage, since the same metal is used in both the n-MOSFET region 10 and the p-MOSFET region 20, the difficulty encountered in conventional dual metal formation does not occur during etching.

The gate thus obtained has a poly-Si (or W)/metal/high-k/SiO/Si structure in the n-MOSFET region 10 and has a poly-Si (or W)/metal/diffusion barrier film/high-k/SiO/Si structure in the p-MOSFET region 20.

Figure 13:
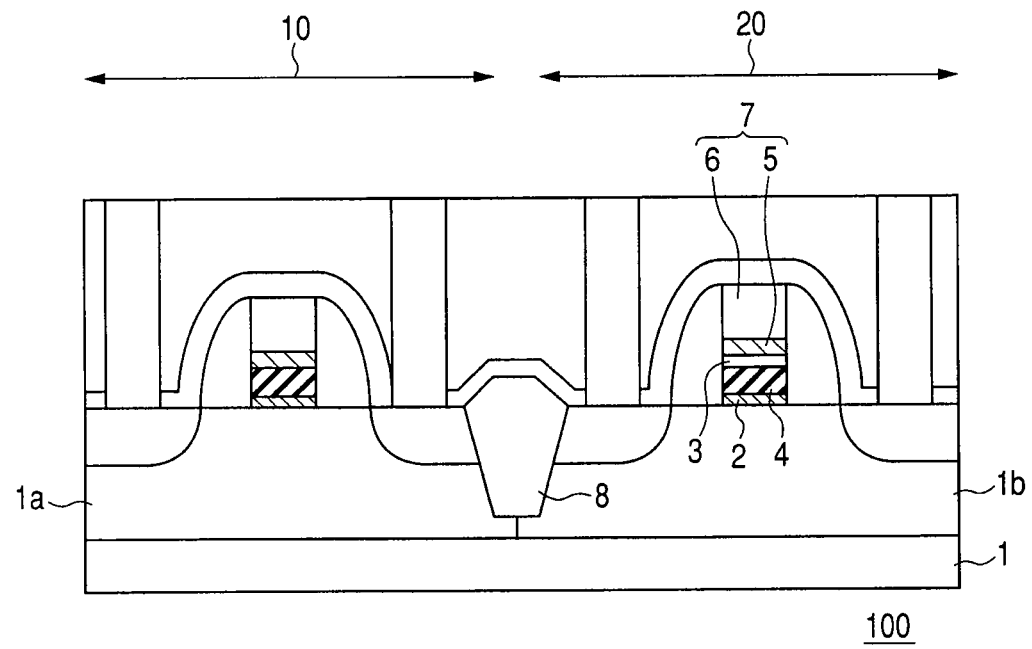
FIG. 13 is a cross-sectional view illustrating a manufacturing step of the semiconductor device according to Embodiment 3.

After gate etching, offset formation, extension implantation, SW formation, deep S/D implantation, silicide formation, and contact formation are carried out as in the formation of a conventional transistor (FIG. 13). Due to high-temperature heat treatment such as S/D activation annealing, the rare earth element or Mg contained in the metal layer 5 diffuses into the high-k insulating film 4 and reaches even a high-k/SiO interface in the n-MOSFET region 10. In the p-MOSFET region 20, on the other hand, the diffusion barrier film 3 prevents diffusion of the rare earth element or Mg contained in the metal layer 5 into the high-k insulating film 4.

According to the semiconductor device 300 of the present embodiment, the work function decreases to a value suited for the n-MOSFET by the diffusion of the rare earth element or Mg into the high-k/SiO(N) interface in the n-MOSFET region 10. In the p-MOSFET region 20, on the other hand, the diffusion of the rare earth element or Mg into the high-k insulating film 4 is suppressed and the work function remains suited for the p-MOSFET.

Accordingly, it is possible to form a single metal/dual high-k structure with a good shape without processing a highly hygroscopic La compound and therefore achieve flat band voltages suited for the n-MOSFET region 10 and the p-MOSFET region 20, respectively.

Embodiment 4

Figure 14:
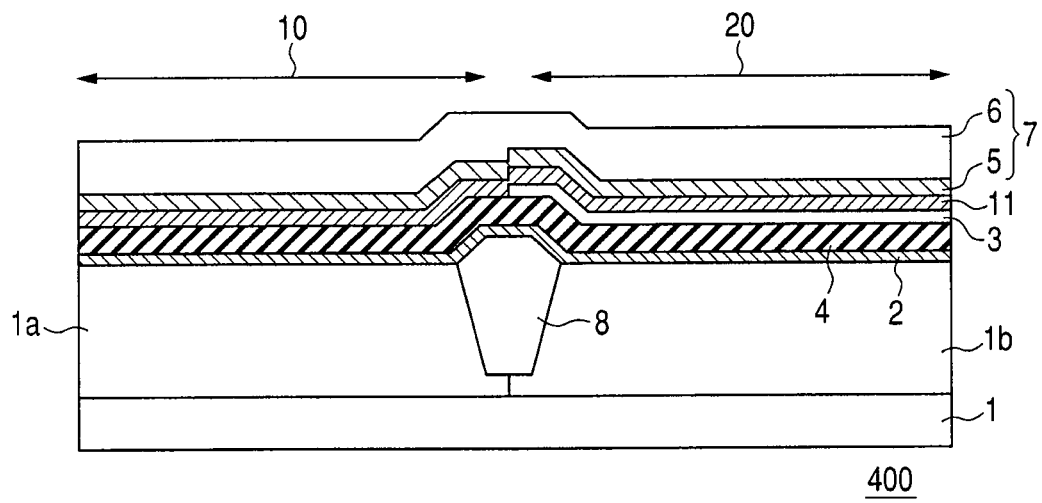
FIG. 14 is a cross-sectional view illustrating a manufacturing step of a semiconductor device according to Embodiment 4.
Figure 15:
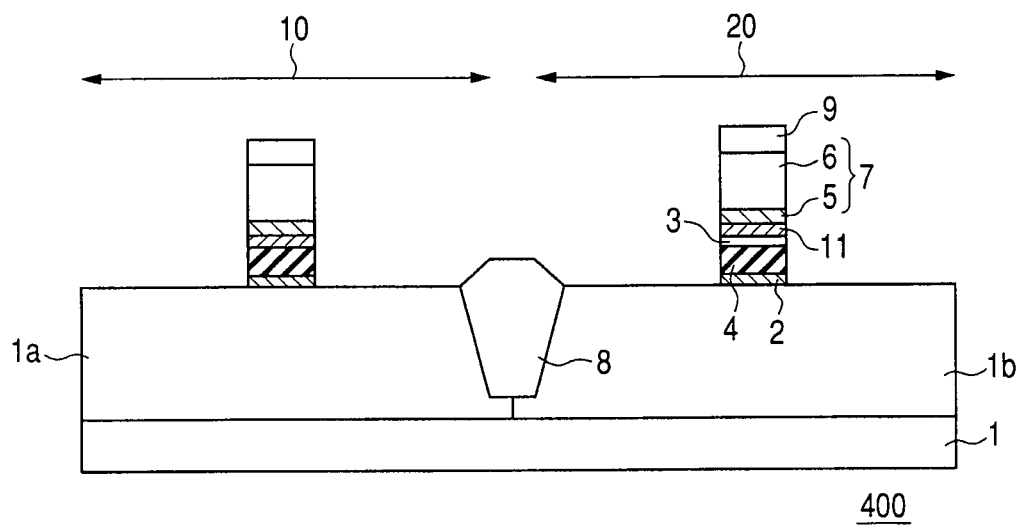
FIG. 15 is a cross-sectional view illustrating a manufacturing step of the semiconductor device according to Embodiment 4.
Figure 16:
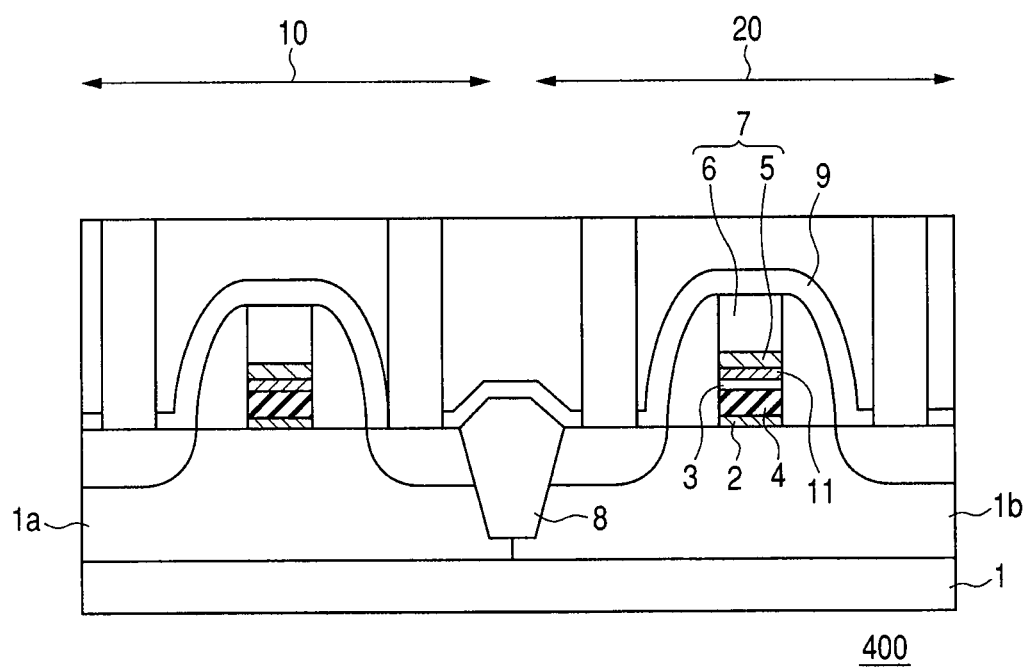
FIG. 16 is a cross-sectional view illustrating a manufacturing step of the semiconductor device according to Embodiment 4.

FIGS. 14 to 16 are cross-sectional views illustrating the manufacturing steps of a semiconductor device 400 according to Embodiment 4 of the invention. They correspond to FIGS. 11 to 13 in Embodiment 3. Drawings illustrating other manufacturing steps are omitted because they are similar to those of Embodiment 3. The semiconductor device 400 according to this embodiment has, in addition to the configuration of the semiconductor device 300, a capping layer 11 between the high-k insulating film 4 and the metal layer 5 in the n-MOSFET region 10 and between the diffusion barrier film 3 and the metal layer 5 in the p-MOSFET region 20.

A manufacturing method of the semiconductor device 400 will hereinafter be described referring to FIGS. 14 to 16. Description on the steps illustrated in FIGS. 9 and 10 is omitted because it is similar to that of Embodiment 3. After patterning of the diffusion barrier film 3, a capping layer 11 (LaO, MgO, or the like) of from 5 to 20 nm thick containing a rare earth element or Mg is formed over the high-k insulating film 4 and the diffusion barrier film 3. Then, a metal layer 5 (from about 5 to 20 nm thick) and a poly-Si layer 6 or W (from about 80 to 120 nm thick) are stacked successively to form a gate electrode 7 (FIG. 14).

The metal layer 5 to be used in the present embodiment is comprised of a metal having a work function suited upon formation of the p-MOSFET 20. For example, the metal layer 5 is comprised of TiN, TaN, or the like, the high-k insulating film 4 is comprised of HfSiON, and the capping layer 11 is comprised of $La_2O_3$.

Then, a mask is formed and with the mask, the silicon oxide film interfacial layer 2, the diffusion barrier film 3, the high-k insulating film 4, the capping layer 11, and the gate electrode 7 are etched to form a gate pattern (FIG. 15). Since the same metal is employed in both the n-MOSFET region 10 and the p-MOSFET region 20, the difficulty encountered in conventional dual metal formation does not occur during etching.

The gate thus obtained has a poly-Si (or W)/metal/capping layer/high-k/SiO/Si structure in the n-MOSFET region 10 and a poly-Si (or W)/metal/capping layer/diffusion barrier film/high-k/SiO/Si structure in the p-MOSFET region 20.

After gate etching, offset formation, extension implantation, SW formation, deep S/D implantation, silicide formation, and contact formation are carried out as in the formation of a conventional transistor (FIG. 16). Due to high-temperature heat treatment such as S/D activation annealing, the rare earth element or Mg contained in the capping layer 11 diffuses into the high-k insulating film 4 in the n-MOSFET region 10 and reaches even a high-k/SiO interface in the n-MOSFET region 10. In the p-MOSFET region 20, on the other hand, the diffusion barrier film 3 prevents diffusion of the rare earth element or Mg contained in the capping layer 11 into the high-k insulating film 4 which will otherwise occur due to the heat treatment.

According to the semiconductor device 400 of the present embodiment, the work function decreases to a value suited for the n-MOSFET by the diffusion of the rare earth element or Mg into the high-k/SiO(N) interface in the n-MOSFET region 10. In the p-MOSFET region 20, on the other hand, the diffusion of the rare earth element or Mg into the high-k insulating film 4 is suppressed and the work function remains suited for the p-MOSFET.

Accordingly, it is possible to form a single metal/dual high-k structure with a good shape without processing a highly hygroscopic La compound and therefore achieve flat band voltages suited for the n-MOSFET region 10 and the p-MOSFET region 20, respectively.

The invention can therefore be applied to any transistor that is equipped with a high-k/metal gate and has a single metal/dual high-k structure formed by the gate first process.

The invention claimed is:

1. A semiconductor device comprising a first conductivity type MOSFET and a second conductivity type MOSFET,
    wherein the first conductivity type MOSFET comprises:
    a first insulating film formed over a semiconductor substrate;
    a second insulating film formed over the first insulating film and containing hafnium, a rare earth element or Mg, and oxygen as main components, comprised of an insulating material having a higher dielectric constant than the first insulating film; and
    a first gate electrode formed over the second insulating film and having a first metal layer comprising any one of TiN and TaN; and wherein the second conductivity type MOSFET comprises:
    a third insulating film aligned with the first insulating film over the semiconductor substrate over which the first insulating film is placed;
    a fourth insulating film formed over the third insulating film and containing hafnium and oxygen as main components, comprised of an insulating material having a higher dielectric constant than the third insulating film;
    a cap layer formed over the fourth insulating film and containing a rare earth element or Mg;
    a second gate electrode formed over the cap layer and having a second metal layer comprising any one of TiN and TaN; and
    a diffusion barrier film formed between the fourth insulating film and the cap layer to prevent diffusion of the rare earth element or Mg into the fourth insulating film,
    wherein the diffusion barrier film comprises $Al_2O_3$ or AlN.

2. The semiconductor device according to claim 1,
    wherein the first conductivity type MOSFET is an n-MOSFET and the second conductivity type MOSFET is a p-MOSFET.

* * * * *